US011189542B2

(12) United States Patent
Fuergut et al.

(10) Patent No.: US 11,189,542 B2
(45) Date of Patent: Nov. 30, 2021

(54) METHOD FOR FABRICATING AN ELECTRONIC MODULE VIA COMPRESSION MOLDING

(71) Applicant: Infineon Technologies Austria AG, Villach (AT)

(72) Inventors: Edward Fuergut, Dasing (DE); Dae Kuen Park, Irvine, CA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/792,776

(22) Filed: Feb. 17, 2020

(65) Prior Publication Data
US 2020/0266121 A1    Aug. 20, 2020

(30) Foreign Application Priority Data
Feb. 18, 2019   (DE) .......................... 102019104010.8

(51) Int. Cl.
*H01L 23/495*     (2006.01)
*H01L 23/34*      (2006.01)
(Continued)

(52) U.S. Cl.
CPC ........ *H01L 23/3675* (2013.01); *H01L 21/565* (2013.01); *H01L 23/295* (2013.01); *H01L 23/3107* (2013.01); *H01L 23/3121* (2013.01); *H01L 23/3135* (2013.01); *H01L 23/3737* (2013.01); *H01L 23/49503* (2013.01);
(Continued)

(58) Field of Classification Search
CPC .............. H01L 23/49551; H01L 21/56; H01L 2924/181; H01L 24/85; H01L 23/49568; H01L 23/49575; H01L 24/97; H01L 25/0655; H01L 25/072; H01L 23/3675; H01L 21/565; H01L 23/295; H01L 23/3121; H01L 23/3135; H01L 23/3737; H01L 23/49502; H01L 23/49541; H01L 23/23; H01L 23/49503; H01L 23/3107
See application file for complete search history.

(56) References Cited

U.S. PATENT DOCUMENTS 5,703,399 A    12/1997 Majumdar et al.
5,891,759 A     4/1999 Otsuki
(Continued)

FOREIGN PATENT DOCUMENTS

DE       19904279 A1    8/2000
DE    102009014794 B3   11/2010
(Continued)

*Primary Examiner* — Alonzo Chambliss
(74) *Attorney, Agent, or Firm* — Murphy, Bilak & Homiller, PLLC

(57) ABSTRACT

An electronic module includes a semiconductor package having a die pad, a semiconductor die, and an encapsulant. The encapsulant has a first main face and a second main face opposite to the first main face. The die pad has a first main face and a second main face opposite to the first main face. The semiconductor die is disposed on the second main face of the die pad. An insulation layer is disposed on at least a portion of the first main face of the encapsulant and on the (Continued)

first main face of the die pad. The insulation layer is electrically insulating and thermally conducting. A heatsink is disposed on or in the insulation layer.

10 Claims, 9 Drawing Sheets

(51) Int. Cl.
*H01L 21/00* (2006.01)
*H01L 23/367* (2006.01)
*H01L 23/31* (2006.01)
*H01L 23/373* (2006.01)
*H01L 21/56* (2006.01)
*H01L 23/00* (2006.01)
*H01L 23/29* (2006.01)
*H01L 25/065* (2006.01)
*H01L 25/07* (2006.01)

(52) U.S. Cl.
CPC .. *H01L 23/49541* (2013.01); *H01L 23/49568* (2013.01); *H01L 23/49575* (2013.01); *H01L 24/97* (2013.01); *H01L 25/0655* (2013.01); *H01L 25/072* (2013.01); *H01L 24/48* (2013.01); *H01L 2224/48091* (2013.01); *H01L 2224/48101* (2013.01); *H01L 2224/48106* (2013.01); *H01L 2224/48137* (2013.01); *H01L 2224/48247* (2013.01)

(56) References Cited

U.S. PATENT DOCUMENTS

| | | | |
|---|---|---|---|
| 8,810,014 B2 * | 8/2014 | Lim | H01L 23/49548 257/675 |
| 8,890,310 B2 * | 11/2014 | Lee | C04B 37/028 257/706 |
| 10,770,380 B2 * | 9/2020 | Kimura | H01L 23/3114 |
| 2005/0056918 A1 * | 3/2005 | Jeun | H01L 23/49575 257/678 |
| 2006/0056213 A1 * | 3/2006 | Lee | H01L 25/162 363/144 |
| 2010/0013070 A1 * | 1/2010 | Lee | C04B 37/028 257/676 |
| 2010/0176498 A1 * | 7/2010 | Lee | H01L 25/162 257/675 |
| 2012/0027928 A1 | 2/2012 | Otremba | |
| 2014/0210093 A1 * | 7/2014 | Wang | H01L 23/3107 257/773 |

FOREIGN PATENT DOCUMENTS

| | | |
|---|---|---|
| DE | 102012112682 A1 | 6/2013 |
| DE | 102012102847 A1 | 10/2013 |
| DE | 102013112592 A1 | 5/2014 |
| DE | 102014100282 A1 | 7/2014 |
| DE | 102013220880 A1 | 4/2015 |
| EP | 0774782 A2 | 5/1997 |
| EP | 0777273 A2 | 6/1997 |
| JP | H10261744 A | 9/1998 |

* cited by examiner

E

F

METHOD FOR FABRICATING AN ELECTRONIC MODULE VIA COMPRESSION MOLDING

TECHNICAL FIELD

The present disclosure is related to an electronic module, an electronic device, and a method for fabricating an electronic module.

BACKGROUND

During operation an electronic module comprising a semiconductor die may produce heat which may have to be dissipated through one or more designated thermal pathways. A thermal pathway may be directed towards a top side of the electronic module, wherein heat dissipation means like, for example, a heat sink may be arranged on the top side of the electronic module. It may be desirable to reduce a thermal resistance between the semiconductor die and the heat dissipation means in order to improve a heat dissipation capability of the electronic module.

SUMMARY

A first aspect of the present disclosure is related to an electronic module comprising a semiconductor package comprising a die pad, a semiconductor die, and an encapsulant wherein the encapsulant comprises a first main face and a second main face opposite to the first main face, the die pad comprises a first main face and a second main face opposite to the first main face, and the semiconductor die being disposed on the second main face of the die pad, an insulation layer disposed on at least a portion of the first main face of the encapsulant and on the first main face of the die pad, wherein the insulation layer is electrically insulating and thermally conducting, and a heatsink disposed on or in the insulation layer so that main face of the heatsink is exposed to the outside.

A second aspect of the present disclosure is related to a method for fabricating an electronic module, the method comprising providing a semiconductor package comprising a die pad, a semiconductor die, and an encapsulant, wherein the encapsulant comprises a first main face and a second main face opposite to the first main face, the die pad comprises a first main face and a second main face opposite to the first main face, and the semiconductor being disposed on the second main face of the die pad, applying an insulation layer and a heatsink onto the first main face of the encapsulant and on the first main face of the die pad so that the heatsink is disposed on or in the insulation layer, wherein the insulation layer is electrically insulating and thermally conducting.

A third aspect of the present disclosure is related to an electronic device comprising a semiconductor package comprising a die pad, a semiconductor die, and an encapsulant, wherein the encapsulant comprises a first main face and a second main face opposite to the first main face, the die pad comprises a first main face and a second main face opposite to the first main face, and the semiconductor die being disposed on the second main face of the die pad, an insulation layer disposed on the first main face of the encapsulant and on the first main face of the die pad, wherein the insulation layer is electrically insulating and thermally conducting, a first heatsink disposed on or in the insulation layer, and a second heatsink disposed on the insulation layer and the first heatsink.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

DETAILED DESCRIPTION

Figure 1:
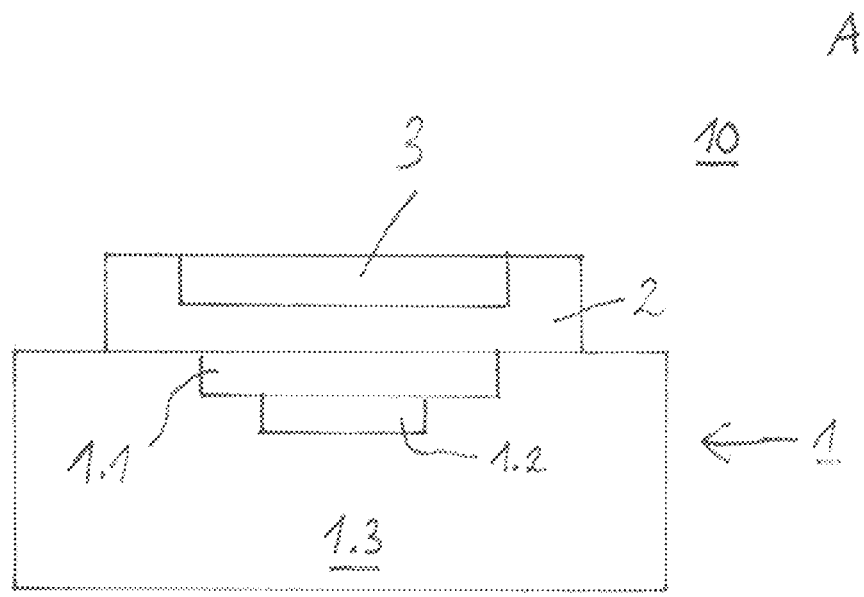
FIG. 1 shows a schematic side view representation (A) and a top view representation (B) of an example of an electronic module according to the first aspect.
Figure 1:
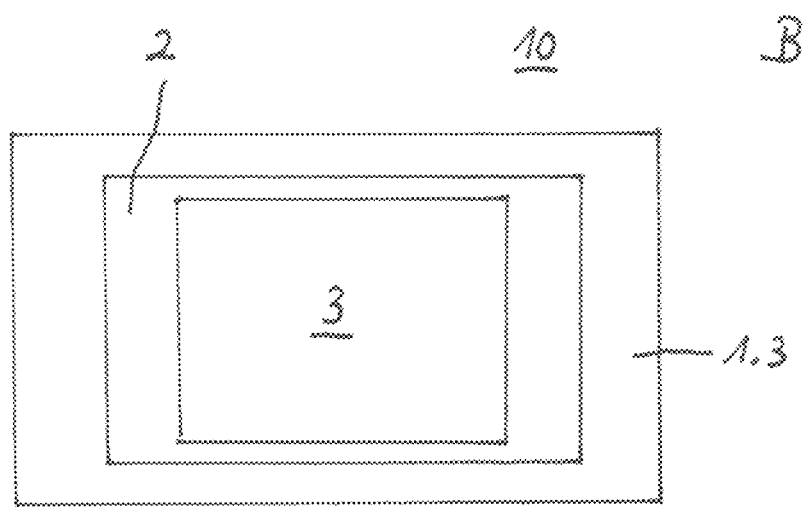

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

Devices or semiconductor packages containing semiconductor dies are described below. The semiconductor dies may be of different types, may be manufactured by different technologies and may include for example integrated electrical, electro-optical or electro-mechanical circuits and/or passives. The devices can be power devices and the packages can be power packages. The semiconductor dies may, for example, be designed as logic integrated circuits, analog integrated circuits, mixed signal integrated circuits, power integrated circuits, memory circuits or integrated passives. They may include control circuits, microprocessors or microelectromechanical components. Further, they may be configured as power semiconductor dies, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. In particular, semiconductor dies having a vertical structure may be involved, that is to say that the semiconductor dies may be fabricated in such a way that electric currents can flow in a direction perpendicular to the main faces of the semiconductor dies. A semiconductor die having a vertical structure may have contact elements in particular on its two main faces, that is to say on its top side and bottom side. In particular, power semiconductor dies may have a vertical structure. By way of example, the source electrode and gate electrode of a power MOSFET may be situated on one main face, while the drain electrode of the power MOSFET is arranged on the other main face. Furthermore, the electronic modules described below may include integrated circuits to control the integrated circuits of other semiconductor dies, for example the integrated circuits of power semiconductor dies. The semiconductor dies can be manufactured on the basis of a specific semiconductor material, for example Si, SiC, SiGe, GaAs, GaN, AlGaAs, but can also manufactured on the basis of any other semiconductor material and, furthermore, may contain inorganic and/or organic materials that are not semiconductors, such as for example insulators, plastics or metals.

The various examples of an electronic module described below may include external contact elements. The external contact elements may represent the external terminals of the semiconductor package. They may be accessible from outside the package and may thus allow electrical contact to be made with the semiconductor dies(s) from outside the package. Furthermore, the external contact elements may be thermally conductive and may serve as heat sinks for dissipating at least part of the heat generated by the semiconductor die. The external contact elements may be part of a leadframe, in particular a Cu leadframe.

The semiconductor package of the electronic module includes an encapsulant. The encapsulant may be a dielectric material and may be made of any appropriate duroplastic, thermoplastic or thermosetting material or laminate (prepreg) and may be made by molding. The encapsulant may contain filler materials. After its deposition, the encapsulant may be only partially hardened and may be completely hardened after application of energy (e.g. heat, UV light, etc.) to form an encapsulant. Various techniques may be employed to apply the encapsulant, for example transfer molding, compression molding, injection molding, powder molding, liquid molding, dispensing, laminating, or glob top.

FIG. 1 shows an electronic module according to the first aspect in a schematic side view representation (A) and in a top view representation (B). The electronic module 10 of FIG. 1 comprises a semiconductor package 1 comprising a die pad 1.1, a semiconductor die 1.2, and an encapsulant 1.3, wherein the encapsulant 1.3 comprises a first main face and a second main face opposite to the first main face, the die pad 1.1 comprises a first main face and a second main face opposite to the first main face, and the semiconductor die 1.2 being disposed on the second main face of the die pad 1.1, an insulation layer 2 disposed on the first main face of the encapsulant 1.3 and on the first main face of the die pad 1.1, wherein the insulation layer 2 is electrically insulating and thermally conducting, and a heatsink 3 disposed on or in the insulation layer 2 so that a main face of the heatsink 3 is exposed to the outside.

The electronic module 10 of FIG. 1 may also comprise external leads which are not shown for sake of clarity. The external leads can have different forms which will be shown in further examples later.

According to an example of the electronic module of the first aspect, the insulation layer 2 comprises one or more of a resin matrix material, a thermoset material, an epoxy, a silicone, a thermal interface material, a thermoplast, a thermal adhesive, a thermoplast, or a thermal interface material (TIM). Any such kinds of host materials can in addition be filled with a filler material configured to improve a thermal conductivity of the host material. The filler material may comprise particles of one or more of $SiO_2$, $Al_2O_3$, AlN, $Si_3N_4$, BN, or diamond. The insulation layer may comprise a thermal conductivity of >1 W/mK, more specifically >2 W/mK, more specifically >3 W/mK.

According to an example of the electronic module of the first aspect, the heatsink 3 is formed of only one homogeneous material, in particular a metal as e.g. Cu or Al, or a thermal interface material (TIM). The heatsink 3 may also be formed of a conductive adhesive, an indium solder, a copper paste, a phase change material, soft Al, pure Al, a CNC material, a magnetic iron material, a Sn/Ag layer, or a porous layer of any appropriate material. Also, ceramic can be used as a heatsink 3 in situations in which the aspect of isolation is very important so that a double isolation in the form the insulation layer 2 and the heatsink 3 appears to be desirable. The heatsink 3 may further comprise pin fins or other cooling structures on its outer surface.

Moreover, it is also possible that the heatsink 3 instead of being of one homogeneous material, it can be formed of a composite comprising two or more materials. In particular, the heatsink 3 may comprise a base body and an additional layer disposed on the base body. Either the base body or the additional layer can be comprised of one or more of the materials as suggested above for the heatsink. A specific example thereof will be shown and explained later. In case of ceramic also different ceramic layers can be employed or a ceramic layer together with a layer with another material.

According to an example of the electronic module of the first aspect, the heatsink 3 comprises one or more of a metal as e.g. Cu or Al, a ceramic, or a thermal interface material. Moreover, the heatsink 3 can be formed plate-like and can have a quadratic or rectangular shape. The plate can have a thickness in a range from 100 μm to 5 mm. The heatsink 3 can also be comprised of a foil, in which case the thickness can be in a range from 5 μm to 100 μm.

According to an example of the electronic module of the first aspect, at a least a portion of the first main face of the die pad 1.1 is coplanar with the first main face of the encapsulant 1.3. According to a further example thereof, an entire first main face of the die pad 1.1 is coplanar with the first main face of the encapsulant 1.3. It is also possible that the first main face of the encapsulant 1.3 contains grooves or other specific surface properties that are not coplanar with the first main face of the die pad 1.1.

According to an example of the electronic module of the first aspect, the heatsink 3 is embedded in the insulation layer 2 such that an outer surface of the heatsink 3 is situated slightly above an outer surface of the insulation layer 2.

According to an example of the electronic module of the first aspect, the insulation layer 2 comprises a thermal conductivity of >1 W/mK, more specifically >2 W/mK, more specifically >3 W/mK.

According to an example of the electronic module of the first aspect the die pad 1.1 is part of a leadframe. One or more further die pads and one or more further semiconductor dies can be provided, each one of the further semiconductor dies being disposed on one of the one or more further die pads.

Figure 2:
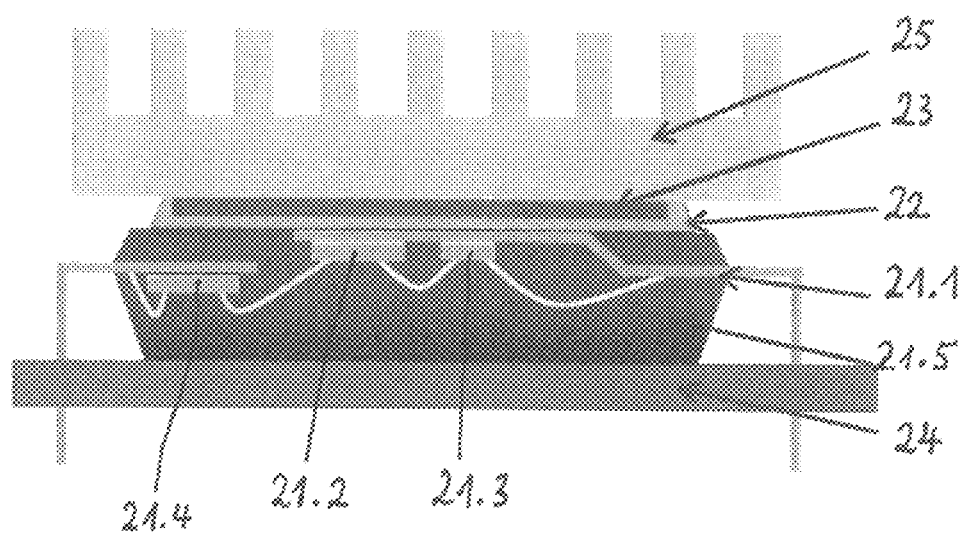
FIG. 2 shows a schematic cross-sectional side view representation of a further example of an electronic module which comprises three semiconductor dies and is mounted on a PCB, wherein an external heatsink is applied onto the insulation layer and the heatsink.

FIG. 2 shows a schematic cross-sectional side view representation of a further example of an electronic module. The electronic module 20 of FIG. 2 comprises a semiconductor package 21 comprising a leadframe 21.1, a first semiconductor die 21.2, a second semiconductor die 21.3, and a third semiconductor die 21.4. The first to third semiconductor dies 21.2 to 21.4 are disposed on different portions of the leadframe 21.1. The first semiconductor die 21.2 can be, for example, a semiconductor transistor die like e.g. an IGBT die. The second semiconductor die 21.3 can be, for example, a semiconductor diode die connected in parallel with the first semiconductor die 21.2. And the third semiconductor die 21.4 can be, for example, a controller die.

The semiconductor package 21 further comprises an encapsulant 21.5, wherein the encapsulant 21.5 comprises a first upper main face and a second lower main face opposite to the first main face. The first and second semiconductor dies 21.2 and 21.3 are disposed on first portions of the leadframe 21.1 which are exposed to the outside of the package and which are at least partially coplanar with the first upper main face of the encapsulant 21.5. The third semiconductor die 21.4 is disposed on another portion of the leadframe which is not exposed to the outside and complete embedded with the encapsulant 21.5.

The semiconductor package 21 further comprises an insulation layer 22 disposed on the first main face of the encapsulant 21.5 and on the first main face of the die pad 21.1, wherein the insulation layer 22 is electrically insulating and thermally conducting, and a heatsink 23 disposed on or in the insulation layer 22. The insulation layer 22 and the heatsink 23 can have the same properties and features as the insulation layer 22 and the heatsink 23 of the example of FIG. 1. In the example of FIG. 2 the heatsink 23 may be comprised of a foil.

The electronic module 20 can be configured as a dual-inline (DIP) module which usually comprises a rectangular housing and two parallel rows of electrical connecting pins arranged on opposing sides. On the customer's side the electronic module 20 may be through-hole mounted to a printed circuit board (PCB) 24 and an external heatsink 25 can be arranged on top of the insulation layer 22 and the heatsink 23.

Figure 3:
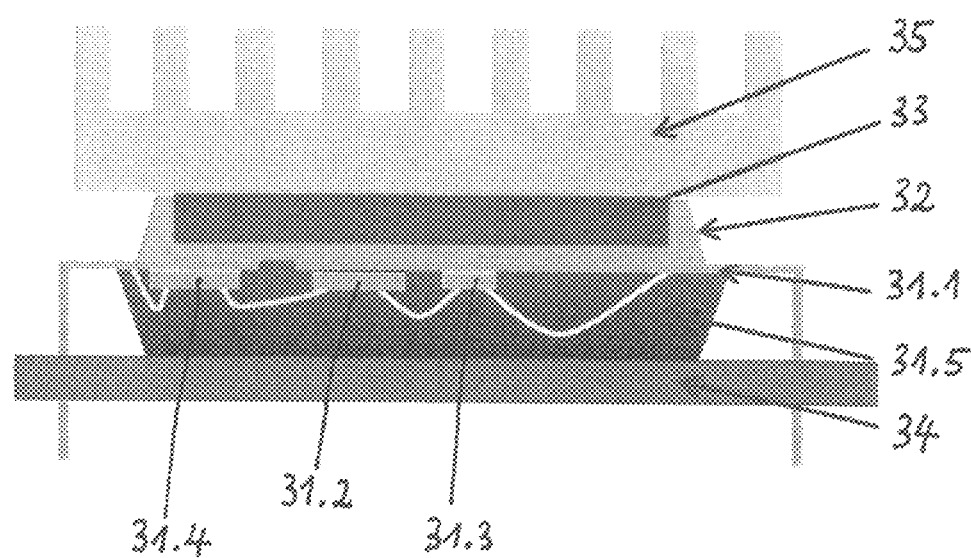
FIG. 3 shows a schematic cross-sectional side view representation of a further example of an electronic module which is similar to the example of FIG. 2, wherein the three semiconductor dies are arranged in one and the same plane.

FIG. 3 shows a schematic cross-sectional side view representation of a further example of an electronic module. The electronic module 30 of FIG. 3 is similar to the electronic module 20 of FIG. 2 so that the different components of the electronic module 30 will not be described again. The electronic module 30 comprises a semiconductor package 31 comprising a leadframe 31.1, a first semiconductor die 31.2, a second semiconductor die 31.3, and a third semiconductor die 31.4. The first to third semiconductor dies 31.2 to 31.4 are disposed on different portions of the leadframe 31.1 and they can be functionally similar to the first of third semiconductor dies 21.2 to 21.4 of the example of FIG. 2.

Although in FIGS. 2 and 3 examples have been shown and described in which the present disclosure is employed in specific types of semiconductor packages, it should be emphasized that the present disclosure can be applied to practically all types of semiconductor packages, including all types of TO (transistor outline) packages, BGA (ball grid array) packages, leadless packages, SMD (surface mount device) packages, etc. It should also be mentioned that the structure as shown in FIG. 1, for example, can also be built double-side, i.e. applying an insulation layer with embedded heatsink on the other side of the semiconductor package.

The semiconductor package 31 further comprises an encapsulant 31.5, wherein the encapsulant 31.5 comprises a first upper main face and a second lower main face opposite to the first main face. As a difference to the semiconductor module 20 of FIG. 2, the first to third semiconductor dies 31.2 to 31.4 are disposed on portions of the leadframe 31.1 which are all exposed to the outside of the package 31 and which are at least partially coplanar with the first upper main face of the encapsulant 31.5.

The semiconductor package 31 further comprises an insulation layer 32 disposed on the first main face of the encapsulant 31.5 and on the first main face of the die pad 31.2, wherein the insulation layer 32 is electrically insulating and thermally conducting, and a heatsink 33 is disposed on or in the insulation layer 2. As a further difference to the electronic module 20 of FIG. 2, the insulation layer 32 and the heatsink 33 are formed much thicker. On the customer's side the electronic module 30 may be through-hole mounted to a printed circuit board (PCB) 34 and an external heatsink 35 can be arranged on top of the insulation layer 32 and the heatsink 33. In the example of FIG. 3 the heatsink 33 may be comprised of a plate, in particular a Cu plate.

Figure 4:
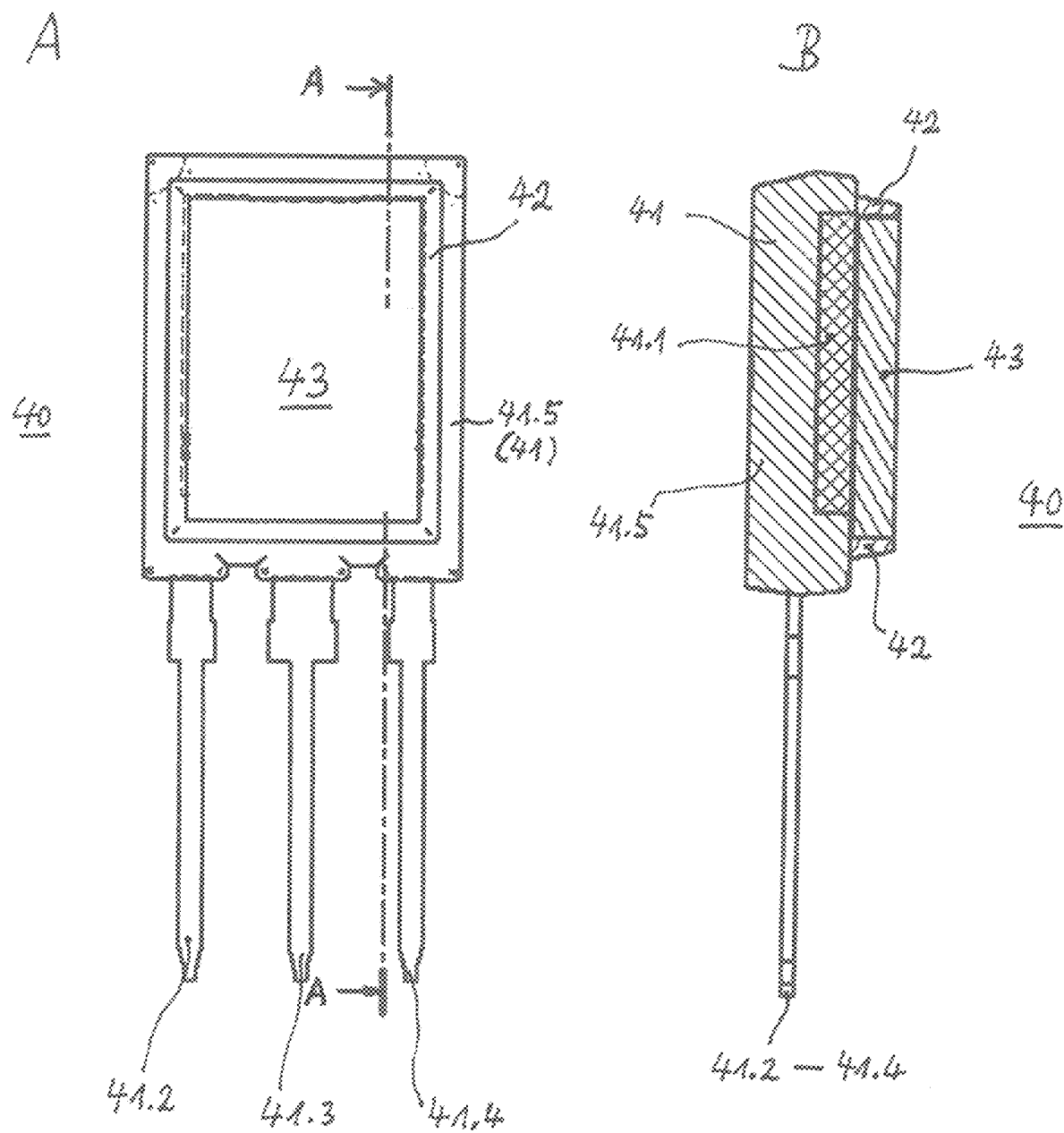
FIG. 4 shows a schematic cross-sectional side view representation (A) and a top view representation (B) of a further embodiment of an electronic module which comprises three parallel external leads.

FIG. 4 shows a top view representation (A) and a cross-sectional side view representation (B) of a further example of an electronic module which is an example of a transistor outline (TO) package. The electronic module 40 of FIG. 4 comprises a semiconductor package 41 comprising a die pad

41.1 having a semiconductor die disposed thereon (not shown). The semiconductor package 41 further comprises three parallel external leads 41.2, 41.3, and 41.4. The external leads 41.2 to 41.4 and the die pad 41.1 can be part of a leadframe. The semiconductor package 41 further comprises an encapsulant 41.5 the shape and properties of which can be equal or similar to the encapsulants of the previously described examples.

The electronic module 40 further comprises an insulation layer 42 and a heatsink 43 which is embedded in the insulation layer 42. Both the insulation layer 42 and the heatsink 43 can have shapes and properties similar or equal to the insulation layers and heatsinks of the previously describe examples.

Figure 5:
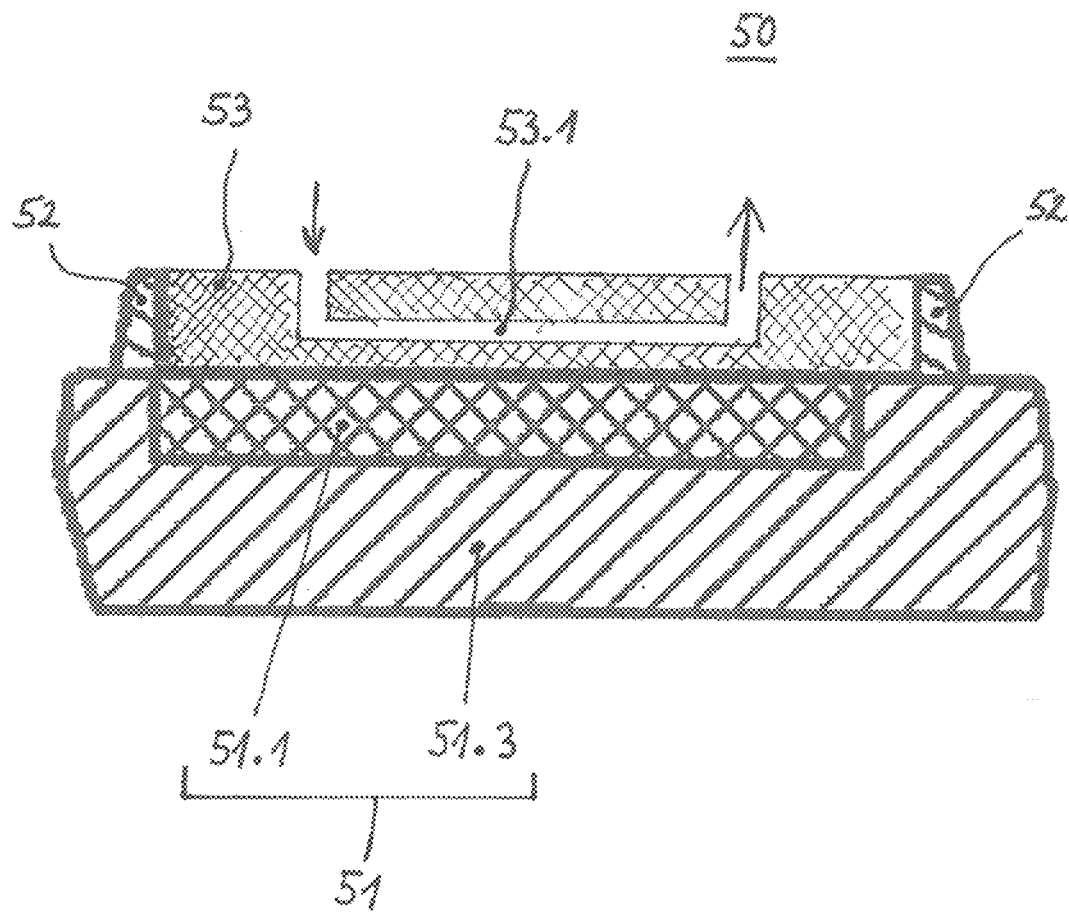
FIG. 5 shows a schematic cross-sectional side view representation of a further example of an electronic module in which the heatsink comprises a cooling channel with inlet and outlet openings for a cooling medium.

FIG. 5 shows a schematic cross-sectional side view representation of a further example of an electronic module. The electronic module 50 comprises a semiconductor package 51 comprising a die pad 51.1 which supports a semiconductor die (not shown). The semiconductor package 51 further comprises an encapsulant 51.3 wherein the die pad 51.1 is embedded in the encapsulant 51.3. The semiconductor package 51, the die pad 51.1, and the encapsulant 51.3 can have the same shapes and properties as the semiconductor packages, die pads and encapsulants shown and described in the previous examples.

The electronic module 50 further comprises an insulation layer 52 and a heatsink 53 embedded within the insulation layer 52. The heatsink 53 comprises a cooling channel 53.1 with inlet and outlet openings for a cooling medium to flow through the cooling channel 53.1. The cooling medium can be liquid or gaseous and can, for example, be air or water. There can be more than one channel between the inlet and outlet openings and there be also more than one inlet opening and more than one outlet opening at the ends of the one or more channels. The heatsink 53 may be configured such that in addition an external heatsink can be disposed onto the upper surface of the insulation layer 53. Such an external heatsink would have to be configured such that it contains suitable through-bores which would act as passages for the cooling medium to and from the inlet and outlet openings.

Figure 6:
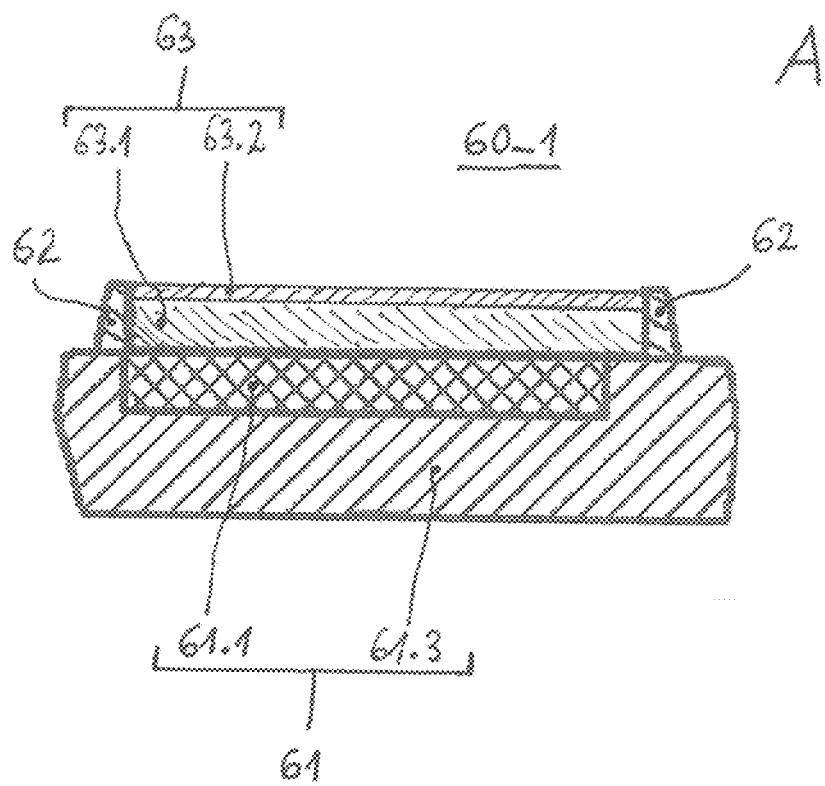
FIG. 6 shows respective schematic cross-sectional side view representations (A) and (B) of further examples of electronic modules in which the heatsink comprises a base body and a layer applied to the base body.
Figure 6:
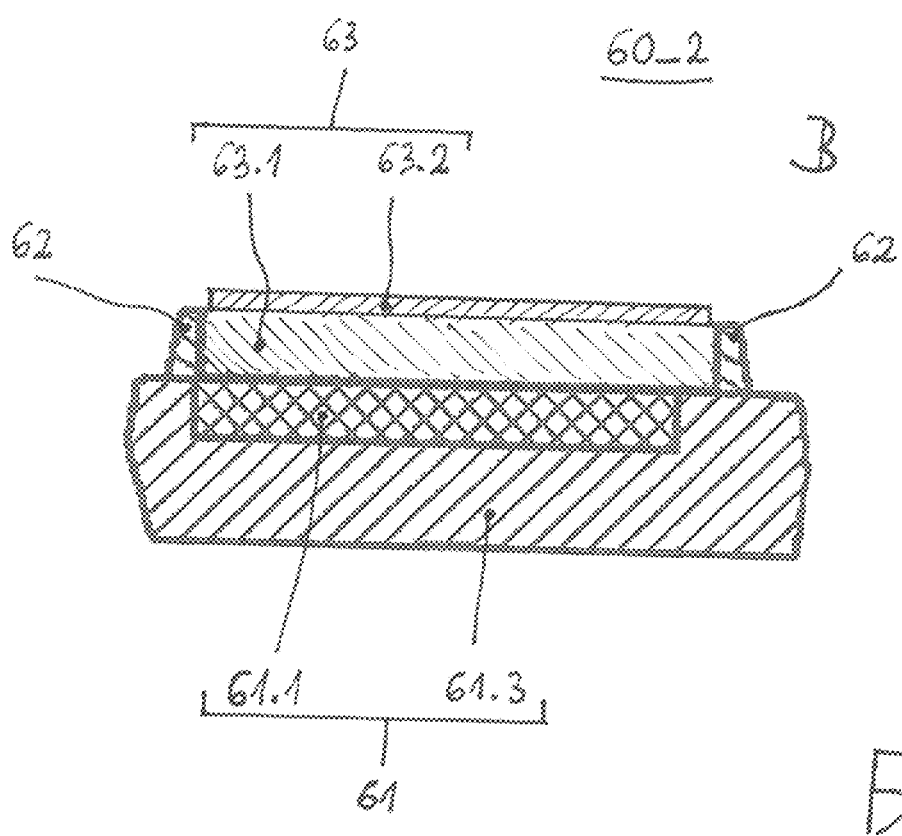

FIG. 6 shows two different examples (A), (B) of electronic modules in which the heatsink comprises a base body and an additional layer applied to the base body.

Example A in FIG. 6 is an electronic module 60_1 that comprises a semiconductor package 61 comprising a die pad 61.1 which supports a semiconductor die (not shown). The semiconductor package 61 further comprises an encapsulant 61.3 wherein the die pad 61.1 is embedded in the encapsulant 61.3. The semiconductor package 61, the die pad 61.1, and the encapsulant 61.3 can have the same shapes and properties as the semiconductor packages, die pads and encapsulants shown and described in the previous examples.

The electronic module 60_1 further comprises an insulation layer 62 and a heatsink 63 embedded within the insulation layer 62. The heatsink 63 comprises a base body 63.1 and an additional layer 63.2 applied onto an upper surface of the base body 63.1. The material of the base body 63.1 can be any one of the materials which were suggested above for the previously described heatsinks. The material of the additional layer 63.2 can, for example, be any kind of thermal interface material (TIM). In particular, the material of the additional layer 63.2 can be selected in order to improve a heat transition to an external heat sink to be applied there. The electronic module 60_1 could be fabricated such that the additional layer 63.2 is applied onto the base body 63.1 before molding of the insulation layer 62.

Example B in FIG. 6 is an electronic module 60_2 which is similar to the electronic module 60_1 of example A so that the same reference numbers were used for the components. The only difference is that only the base body 63.1 is embedded in the insulation layer 62, but the additional layer 63.2 is situated above the insulation layer 62. The electronic module 60_2 could be fabricated such that the additional layer 63.2 is applied onto the base body 63.1 after molding of the insulation layer 62.

Figure 7:
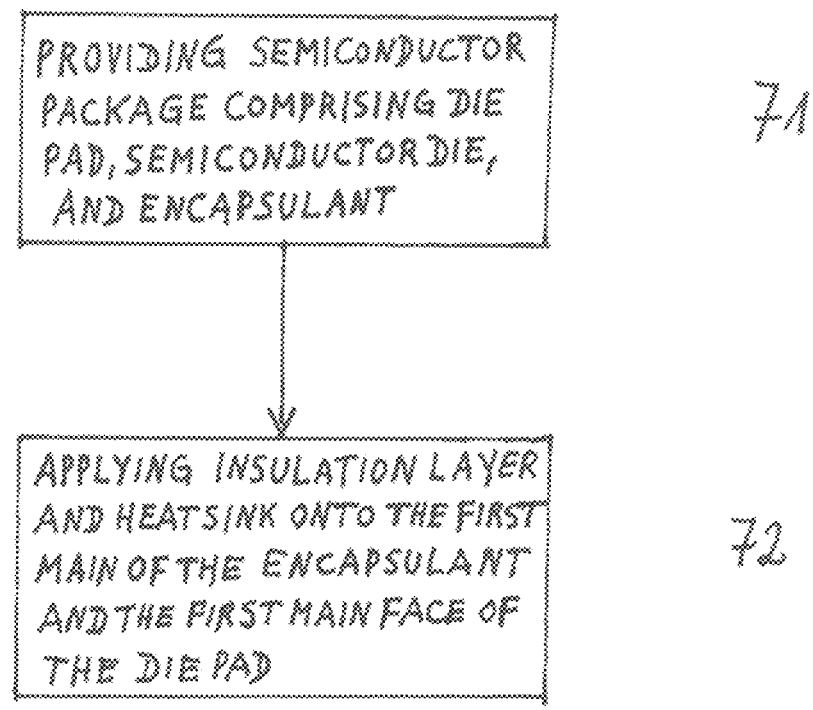
FIG. 7 shows a flowchart of an example of a method of fabricating an electronic module according to the second aspect.

FIG. 7 shows a flowchart of an example of a method of fabricating an electronic module according to the second aspect.

According to FIG. 7 the method 70 comprises providing a semiconductor package comprising a die pad, a semiconductor die, and an encapsulant, wherein the encapsulant comprises a first main face and a second main face opposite to the first main face, the die pad comprises a first main face and a second main face opposite to the first main face, and the semiconductor being disposed on the second main face of the die pad (71), applying an insulation layer and a heatsink onto the first main face of the encapsulant and on the first main face of the die pad so that the heatsink is disposed on or in the insulation layer, wherein the insulation layer is electrically insulating and thermally conducting (72).

According to an example of the method 70 of FIG. 7, applying of the insulation layer and the heatsink comprises molding, in particular compression molding. More specifically, the material of the insulation layer can be dispensed in liquid form onto an upper surface of the encapsulant and the die pad and thereafter the heatsink can be placed onto the dispensed liquid material of the insulation layer. Thereafter the assembly can be placed in a compression molding apparatus and an upper mold tool of the molding apparatus can be pressed downwards against the liquid material of the insulation and the heatsink. After reaching an end position of the upper mold tool the liquid material can be cured and hardened. After hardening of the insulation layer, the assembly can be taken out of the molding apparatus. The whole process will be described in more detail in the following.

Figure 8:
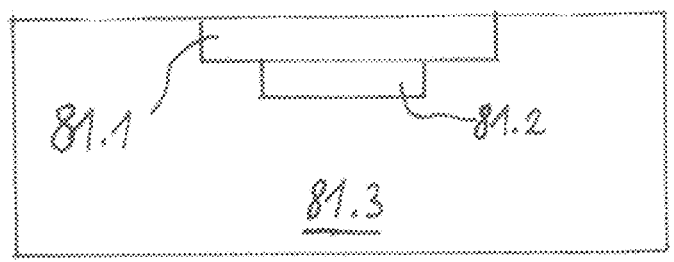
FIG. 8 shows respective cross-sectional side view representations (A) through (F) of an electronic module in various stages of fabrication according to a further example of a method of fabricating an electronic module.
Figure 8:
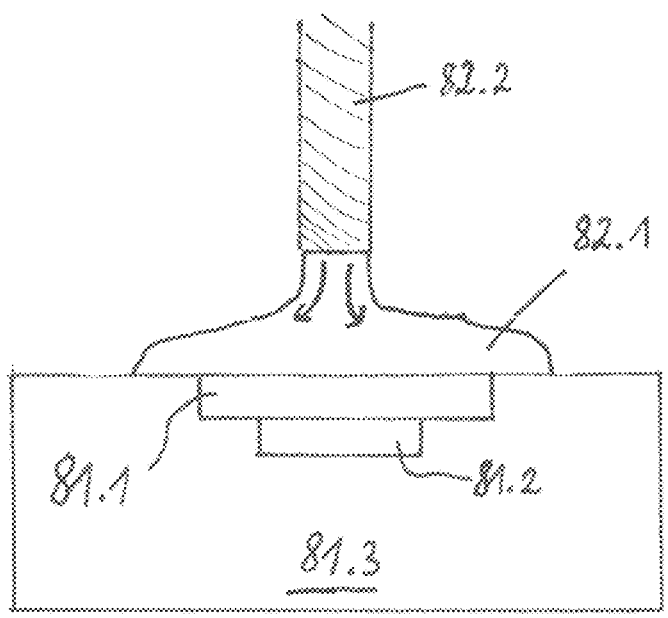
Figure 8:
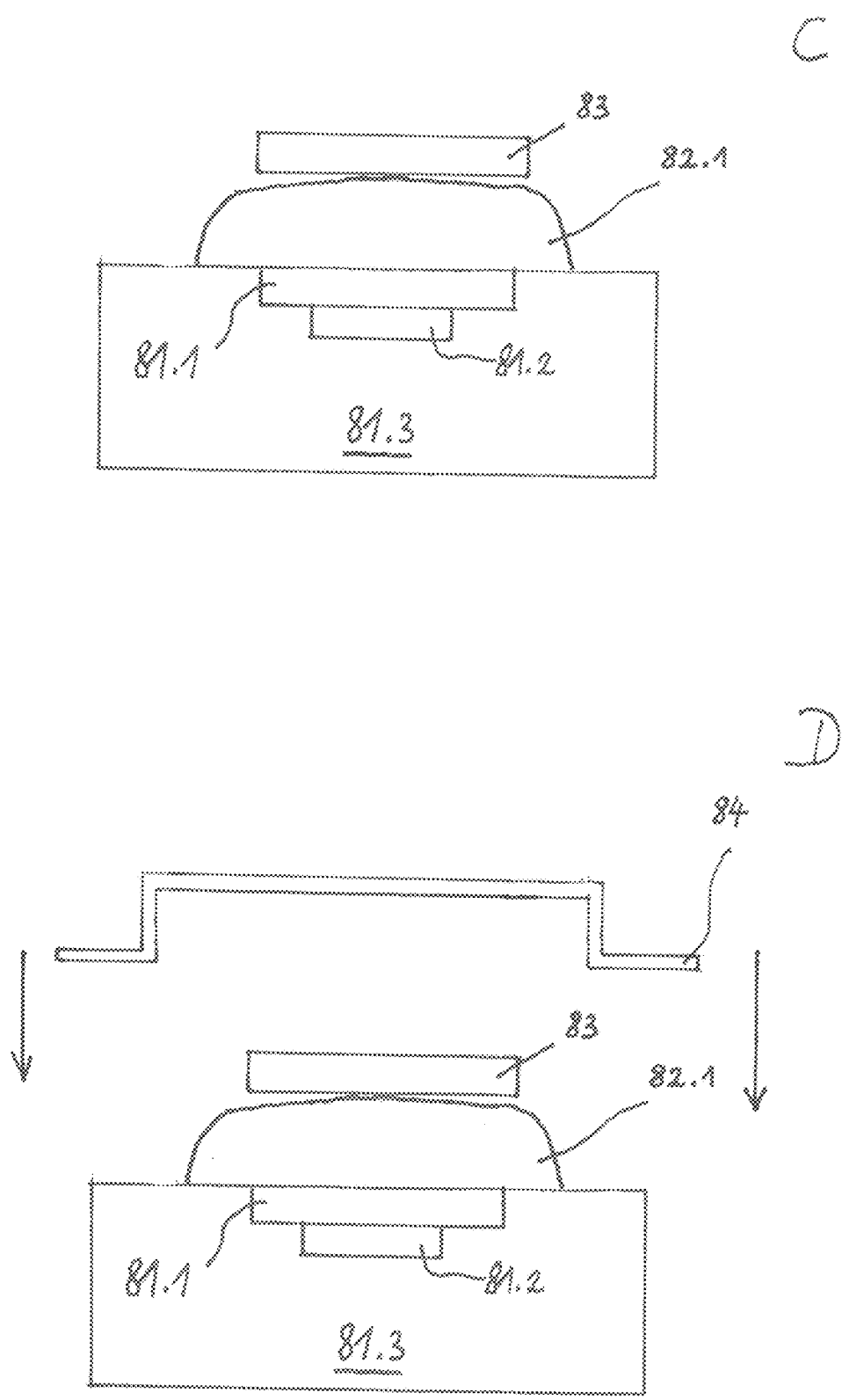
Figure 8:
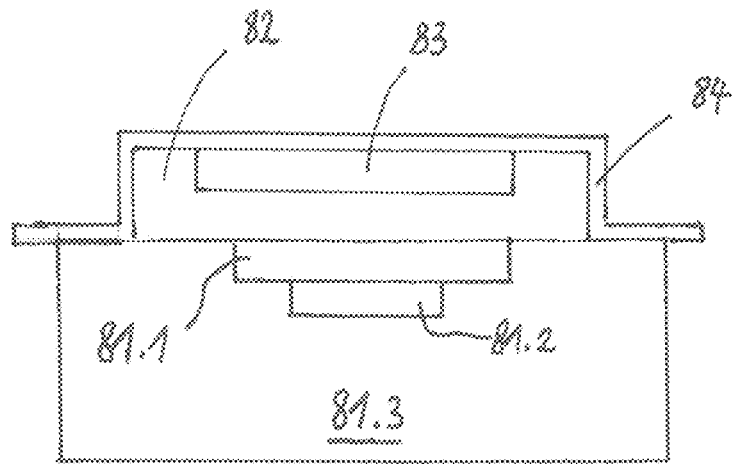
Figure 8:
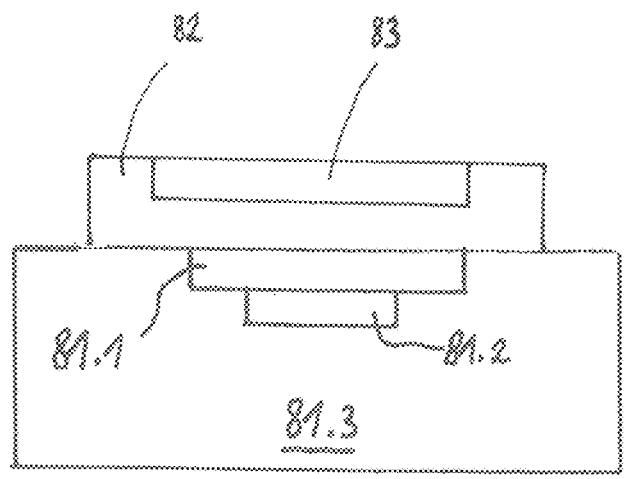

FIG. 8 shows cross-sectional side view representations (A) through (F) of an electronic module in various stages of fabrication according to a further example of a method of fabricating an electronic module.

Representation A in FIG. 8 shows a semiconductor package 81 comprising a die pad 81.1, a semiconductor die 81.2 disposed on the die pad 81.1, and an encapsulant in which the die pad 81.1 and the semiconductor die 81.2 are embedded. It should be noted that not only one semiconductor package but instead a plurality of semiconductor packages can be provided and processed.

Representation B in FIG. 8 shows the dispensing of a liquid material 82.1 by a dispenser 82.2. The liquid material will be fabricated to the insulation layer and it can be in principle selected out of any one of the materials which were suggested above. In case of compression molding, for example, an epoxy resin can be used which can be cured and hardened after molding. The epoxy resin may contain filler materials, in particular micro particles in order to increase the thermal conductance of the insulation layer to be fabricated. Suitable materials of particles have already been suggested above.

Representation C in FIG. 8 shows the semiconductor package 81 with the dispensed liquid material 82.1 and a heatsink 83 placed upon the dispensed liquid material. The heatsink 83 can be, for example, a piece of copper, but also any other materials for the heatsink can be used which were suggested above.

Representation D in FIG. 8 shows the assembly placed in a compression molding apparatus. The molding apparatus comprises an upper mold tool 84 and a lower mold tool (not shown). The assembly is placed onto the lower mold tool. The upper mold tool 84 comprises a recessed portion which corresponds to the shape and contour of the shape and contour of the insulation layer and heatsink to be fabricated. A vacuum of e.g. 1 mbar can be applied. The upper mold tool 84 is moved downwards (see arrows) until the encapsulant has reached an end pressure. In the end position the recessed portion of the upper mold tool 84 is completely filled by the liquid material and the heatsink with respect to the volume of the cavity, the volume of the mold, and the volume of the heatsink.

Representation E in FIG. 8 shows the situation after reaching an end position of the upper mold tool 84. Thereafter heat is applied to the insulation layer 82 so that the insulation layer 82 can be cured.

Representation F in FIG. 8 shows the final product after curing of the insulation layer 82 and taking the product out of the molding apparatus. The electronic module as shown in FIG. 8 corresponds to the electronic module as shown in FIG. 1.

In the following electronic modules and methods for fabricating electronic modules will be described by way of examples.

Example 1 is an electronic module comprising a semiconductor package comprising a die pad, a semiconductor die, and an encapsulant, wherein the encapsulant comprises a first main face and a second main face opposite to the first main face, the die pad comprises a first main face and a second main face opposite to the first main face, and the semiconductor die is disposed on the second main face of the die pad, an insulation layer disposed on at least a portion of the first main face of the encapsulant and on the first main face of the die pad, wherein the insulation layer is electrically insulating and thermally conducting, and a heatsink disposed on or in the insulation layer, wherein a main face of the heatsink is exposed to the outside.

Example 2 is an electronic module according to Example 1, wherein the insulation layer comprises one or more of a resin matrix material, a thermoset material, an epoxy, a silicone, a thermal interface material, a thermoplast, a thermal adhesive, a thermoplast, or a thermal interface material (TIM).

Example 3 is an electronic module according to Examples 1 or 2, wherein the insulation layer comprises a resin matrix material or a host material which is filled with a filler material configured to improve a thermal conductivity of the host material.

Example 4 is an electronic module according to Example 3, wherein the filler material comprises particles of one or more of SiO, AlO, AlN, or BN.

Example 5 is an electronic module according to any one of the preceding examples, wherein the heatsink comprises one or more of a metal, a ceramic, or a thermal interface material plate.

Example 6 is an electronic module according to any one of the preceding examples, wherein the heatsink is formed plate-like.

Example 7 is an electronic module according to Example 6, wherein a thickness of the plate-like heatsink is in a range from 100 μm to 5 mm.

Example 8 is an electronic module according to any one of examples 1 to 5, wherein the heatsink is formed of a foil.

Example 9 is an electronic module according to Example 8, wherein a thickness of the foil is in a range from 5 μm to 100 μm.

Example 10 is an electronic module according to any one of the preceding examples, wherein the heatsink is formed of only one homogeneous material.

Example 11 is an electronic module according to any one of examples 1 to 7, wherein the heatsink is formed of a composite comprising two or more materials.

Example 12 is an electronic module according to example 11, wherein the heatsink comprises a base body and a layer disposed on the base body.

Example 13 is an electronic module according to any one of the preceding examples, wherein the die pad is part of a leadframe.

Example 14 is an electronic module according to any one of the preceding examples, comprising one or more further die pads and one or more further semiconductor dies, each one being disposed on one of the one or more further die pads.

Example 15 is an example of an electronic module comprising a semiconductor package comprising a die pad, a semiconductor die, and an encapsulant, wherein the encapsulant comprises a first main face and a second main face opposite to the first main face, the die pad comprises a first main face and a second main face opposite to the first main face, and the semiconductor die being disposed on the second main face of the die pad, an insulation layer disposed on the first main face of the encapsulant and on the first main face of the die pad, wherein the insulation layer is electrically insulating and thermally conducting, a first heatsink disposed on or in the insulation layer, and a second heatsink disposed on the insulation layer and the first heat sink.

Example 16 is an example of a method for fabricating an electronic module, the method comprising providing a semiconductor package comprising a die pad, a semiconductor die, and an encapsulant, wherein the encapsulant comprises a first main face and a second main face opposite to the first main face, the die pad comprises a first main face and a second main face opposite to the first main face, and the semiconductor being disposed on the second main face of the die pad, applying an insulation layer and a heatsink onto the first main face of the encapsulant and on the first main face of the die pad so that the heatsink is disposed on or in the insulation layer, wherein the insulation layer is electrically insulating and thermally conducting.

Example 17 is a method according to Example 16, wherein applying the insulation layer and the heat spreader comprises molding.

Example 18 is a method according to Example 17, further comprising applying the insulation layer and the heatsink in such a way that the heatsink is embedded in the insulation layer so that an outer surface of the heatsink is disposed slightly above an outer surface of the insulation layer.

Example 19 is a method according to any one of examples 16 to 18, wherein two or more electronic modules are fabricated in parallel.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating an electronic module, the method comprising:
   providing a semiconductor package comprising a die pad, a semiconductor die, and an encapsulant, the encapsulant comprising a first main face and a second main face opposite to the first main face, the die pad comprising a first main face and a second main face opposite to the first main face, the semiconductor being disposed on the second main face of the die pad; and
   applying an insulation layer and a heatsink onto the first main face of the encapsulant and on the first main face of the die pad so that the heatsink is disposed on or in the insulation layer, the insulation layer being electrically insulating and thermally conducting,
   wherein applying the insulation layer and the heatsink comprises:
      dispensing a liquid material of the insulation layer onto the first main face of the encapsulant and onto the first main face of the die pad;
      after the dispensing, placing the heatsink onto the liquid material to form an assembly;
      placing the assembly in a compression molding apparatus;
      pressing an upper mold tool of the compression molding apparatus downwards against both the liquid material and the heatsink;
      after reaching an end position of the upper mold tool, curing and hardening the liquid material to form the insulation layer; and
      after curing and hardening the liquid material, removing the assembly from the compression molding apparatus.

2. The method of claim 1, wherein the insulation layer and the heatsink are applied such that the heatsink is embedded in the insulation layer and an outer surface of the heatsink is disposed slightly above an outer surface of the insulation layer.

3. The method of claim 1, wherein two or more electronic modules are fabricated in parallel.

4. The method of claim 1, wherein the liquid material is an epoxy resin.

5. The method of claim 4, wherein the epoxy resin contains filler materials.

6. The method of claim 5, wherein the filler materials comprise one or more of $SiO_2$, $Al_2O_3$, AlN, $Si_3N_4$, BN, and diamond.

7. The method of claim 1, wherein the upper mold tool a recessed portion which corresponds to a final shape and a final contour of the insulation layer and the heatsink to be fabricated.

8. The method of claim 7, wherein in the end position, the recessed portion of the upper mold tool is completely filled by the liquid material and the heatsink.

9. The method of claim 1, wherein curing the liquid material comprises applying heat to the liquid material.

10. The method of claim 1, wherein the heatsink is a piece of copper.

* * * * *